(12) United States Patent
Sajanikar

(10) Patent No.: US 12,276,971 B2
(45) Date of Patent: Apr. 15, 2025

(54) GENERATING PFS DIAGRAMS FROM ENGINEERING DATA

(71) Applicant: Bentley Systems, Incorporated, Exton, PA (US)

(72) Inventor: Yogesh Sajanikar, Pune (IN)

(73) Assignee: Bentley Systems, Incorporated, Exton, PA (US)

( * ) Notice: Subject to any disclaimer, the term of this patent is extended or adjusted under 35 U.S.C. 154(b) by 539 days.

(21) Appl. No.: 17/587,746

(22) Filed: Jan. 28, 2022

(65) Prior Publication Data

US 2023/0168665 A1 Jun. 1, 2023

(30) Foreign Application Priority Data

Nov. 26, 2021 (IN) .............................. 202111054800

(51) Int. Cl.
  *G05B 19/418* (2006.01)
  *G06F 30/13* (2020.01)
  *H01L 23/528* (2006.01)
  *G05B 17/02* (2006.01)

(52) U.S. Cl.
  CPC ..... *G05B 19/41865* (2013.01); *G05B 19/41835* (2013.01); *G06F 30/13* (2020.01); *H01L 23/528* (2013.01); *G05B 17/02* (2013.01); *G05B 2219/23005* (2013.01); *G05B 2219/23448* (2013.01)

(58) Field of Classification Search
  CPC ...... G06F 30/13; G06F 3/0481; G06F 3/0482; G06F 3/04842; G06F 8/34; G05B 19/41865; G05B 2219/32085
  See application file for complete search history.

(56) References Cited

U.S. PATENT DOCUMENTS

| | | |
|---|---|---|
| 8,477,137 B2 | 7/2013 | Tjhi |
| 9,811,251 B2 | 11/2017 | Kling et al. |
| 11,568,110 B2 * | 1/2023 | McGregor .............. G06F 30/12 |
| 2004/0236711 A1 | 11/2004 | Nixon et al. |

(Continued)

OTHER PUBLICATIONS

"Elkjs", elkjs readme, Eclipse Layout Kernel (ELK), GitHub, Inc., Retrieved from <https://github.com/kieler/elkjs#readme>, Retrieved on Jan. 28, 2022, Jul. 15, 2021, pp. 1-7.

(Continued)

*Primary Examiner* — Nicholas Klicos
(74) *Attorney, Agent, or Firm* — Cesari and McKenna, LLP; James A. Blanchette

(57) ABSTRACT

In example embodiments, a multi-stage PFS diagram generation technique is used to iteratively define the layout of a PFS diagram from a subset of engineering data in a 3D model of an industrial process. The multi-stage PFS diagram generation technique may repeatedly call an automatic layout generator, which each time solves for one unknown quality of the PFS diagram (e.g., relative positions of components in the PFS diagram, positions on components in the PFS diagram, sizes of the components in the PFS diagram). The PFS diagram may be adapted based on user preferences, for example to define the subset of engineering data, or to constrain aspects of its layout. Updated PFS diagrams may be generated by selecting different user preferences.

19 Claims, 6 Drawing Sheets

(56) References Cited

U.S. PATENT DOCUMENTS

| | | | | |
|---|---|---|---|---|
| 2008/0052378 | A1* | 2/2008 | Matsuyama | H04L 41/22 |
| | | | | 709/218 |
| 2009/0088875 | A1* | 4/2009 | Baier | G06Q 10/06 |
| | | | | 700/83 |
| 2009/0089709 | A1* | 4/2009 | Baier | G05B 19/409 |
| | | | | 715/817 |
| 2009/0282067 | A1 | 11/2009 | Bendigeri et al. | |
| 2010/0036866 | A1* | 2/2010 | Sitton | G06F 30/13 |
| | | | | 715/709 |
| 2016/0349942 | A1* | 12/2016 | Ericsson | G06F 3/04817 |
| 2017/0199852 | A1* | 7/2017 | Sasikumar | G06F 40/177 |
| 2018/0349461 | A1* | 12/2018 | Bhoovaraghavan | G06F 16/275 |
| 2020/0050181 | A1* | 2/2020 | McDaniel | G05B 17/02 |
| 2021/0406040 | A1* | 12/2021 | Kuduvalli | G06F 9/451 |

OTHER PUBLICATIONS

Kang, Sung-O, et al., "A Digitization and Conversion Tool for Imaged Drawings to Intelligent Piping and Instrumentation Diagrams (P&ID)," MDPI, Energies, Journal, vol. 12, No. 2593, Jul. 5, 2019, pp. 1-26.

Nanda, Yishu, "The Automatic Computer Generation of Process Flow Diagrams from Topological Data," Thesis, Department of Chemical Engineering and Chemical Technology, Imperial College of Science, Technology and Medicine, University of London, London, United Kingdom, Jun. 1990, pp. 1-421.

\* cited by examiner

FIG. 3

GENERATING PFS DIAGRAMS FROM ENGINEERING DATA

RELATED APPLICATIONS

The present application claims the benefit of Indian Patent Application Ser. No. 202111054800, which was filed on Nov. 26, 2021 by Yogesh Sajanikar, for GENERATING PFS DIAGRAMS FROM ENGINEERING DATA, which is hereby incorporated by reference.

BACKGROUND

Technical Field

The present disclosure relates generally to process engineering, and more specifically to automated techniques for generating process flow schema (PFS) diagrams from engineering data in a 3D model of an industrial process.

Background Information

Industrial processes are procedures involving chemical, physical, electrical, or mechanical steps that aid in the manufacturing of an item or items, the movement of an item or items, or the production of an effect in a space. They are a key part of a variety of industries, including the energy (e.g., oil and natural gas), chemical, manufacturing, construction (e.g., heating ventilation and air conditioning (HVAC), and architectural industries. As part of the design, operation and maintenance of industrial processes, it is often desirable to create PFS diagrams (also referred to as process flow diagrams (PFDs). A PFS diagram is a two-dimensional (2D) diagram that describes an industrial process, its constituent tasks, and their sequence. A PFS diagram typically includes representations of major components, connections among components, labels and. operational information (e.g., information regarding temperature, pressure, mass flow rate, density, etc.) and the like. PES diagrams typically do not include representations of more ancillary details, such as instrumentation details, isolation and shutoff valves, minor bypass lines, etc. There are a variety of other diagrams that may be considered related to, or in a sense a form of, PFS diagrams. For example, a piping and instrument drawings (P&ID) may be considered a more detailed firm of a PFS diagram. A P&ID is a more detailed 2D description of an industrial process, its constituent tasks, and their sequence, adding information about more components, connections and ancillary details, among other things to what is normally depicted in a PFS diagram.

Many industrial processes are described in three-dimensional (3D) models (e.g., 3D computer aided design (CAD) models). In some cases, such 3D models may be incorporated into a digital twin of the industrial process. In the context of industrial processes, a digital twin is a virtual representation of the as-designed, as-built, and as-maintained process, augmented with information representing current status, working condition, configuration or other qualities.

It may be desirable to produce a PFS diagram for an industrial process from engineering data in a 3D model, such as a 3D model incorporated into a digital twin. Traditionally, however, this has been a time-consuming manual task. An engineer would look at the 3D model, observe connections among components, and collect properties of the components. The engineer would then draw a PFS diagram manually using the observed and collected information, adding in labels and directional information based on their understanding. For a large project that required many PFS diagrams, all the manual PFS generation could take days or even weeks. Further, such labors often had to be repeated. If any changes were made to the 3D model, existing PFS diagrams may no longer be correct. There typically was no simple way for a PFS diagram to absorb changes. Instead, the engineer generally had to again carefully gather information about components and properties, and manually redraw the PFS diagram.

Accordingly, there is a need for improved techniques for generating PFS diagrams from engineering data in a 3D model of an industrial process.

SUMMARY

In example embodiments, a multi-stage PFS diagram generation technique is used to iteratively define the layout of a PFS diagram from a subset of engineering data in a 3D model of an industrial process. The multi-stage PFS diagram generation technique may repeatedly call an automatic layout generator, which each time solves for one unknown quality of the PFS diagram (e.g., relative position of components in the PFS diagram, connection positions on components in the PFS diagram, and sizes of components in the PFS diagram). The PFS diagram may be adapted based on user preferences, for example, to define the subset of engineering data, or to constrain aspects of its layout. Updated PFS diagrams may be generated by selecting different user preferences.

In one example embodiment, an application executing on a computing device accesses a subset of engineering data in a 3D model of an industrial process, where the subset of engineering data describes a plurality of components of the industrial process. An automatic layout generator initially generates a layout of the PFS diagram by determining relative positions of components in the PFS diagram from the subset of engineering data. Connection positions on components in the PFS diagram are constrained. The automatic layout generator regenerates the layout based on the constrained connection positions. Sizes of the components in the PFS diagram are changed. The automatic layout generator further regenerates the layout based on the changed sizes of the components. The application renders the PFS diagram based on the layout and displays the rendered PFS diagram in a user interface and/or stores the rendered PFS diagram to memory.

In another example embodiment, an application executing on a computing device accesses a subset of engineering data in a 3D model of an industrial process, where the subset of engineering data describes a plurality of components of the industrial process. The application iteratively defines a layout of a PFS diagram by solving one at a time for a plurality of unknown qualities of the PFS diagram, the plurality of unknown qualities include at least relative positions of components in the PFS diagram, connection positions on components in the PFS diagram, and sizes of the components in the PFS diagram. The application renders the PFS diagram based on the layout and displays the rendered PFS diagram in a user interface and/or stores the rendered PFS diagram to memory.

It should be understood that a variety of additional features and alternative embodiments may be implemented other than those discussed in this Summary. This Summary is intended simply as a brief introduction to the reader and does not indicate or imply that the examples mentioned herein cover all aspects of the disclosure or are necessary or essential aspects of the disclosure.

BRIEF DESCRIPTION OF THE DRAWINGS

The description below refers to the accompanying drawings of example embodiments, of which:

FIG. 3 is a screen shot of an example user interface that may be provided to permit selection of a 3D model from which to generate a PFS diagram;

DETAILED DESCRIPTION

Figure 1:
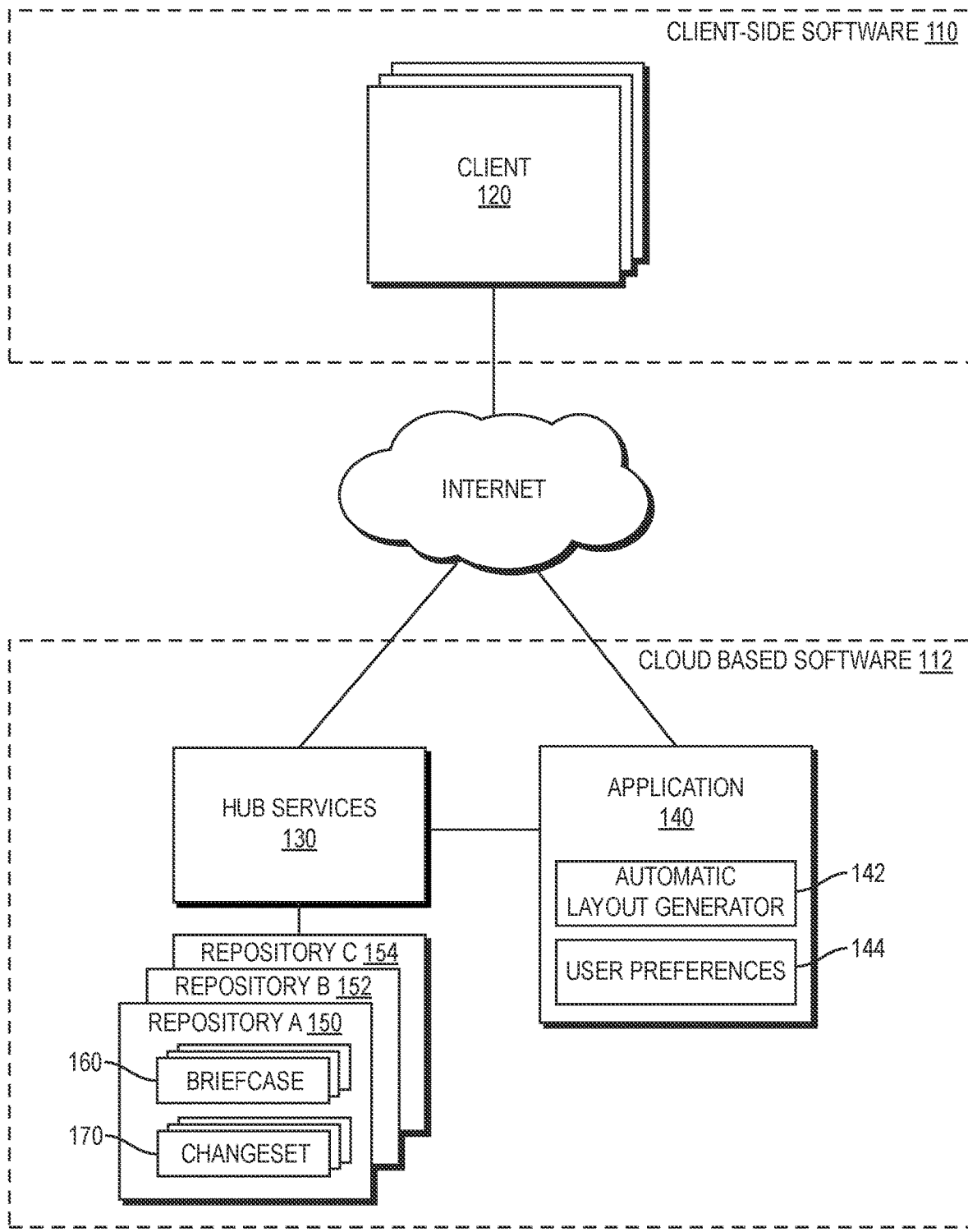
FIG. 1 is a high-level block diagram an example software architecture in which an application that generates a PFS diagram from engineering data may reside.

FIG. 1 is a high-level block diagram an example software architecture in which an application that generates a PFS diagram from engineering data may reside. The architecture may be divided into client-side software 110 executing on one more or more computing devices arranged locally (collectively "client devices"), and cloud-based software 112 executing on one or more remote computing devices ("cloud computing devices") accessible over the Internet.

The client-side software 110 may include client software applications (or simply "clients") 120 operated by users. The clients 120 may be of various types, including desktop clients that operate directly under an operating system of a client device and web clients that operate within a web browser. The clients 120 may handle a number of non-processing intensive operations, for example, providing user interfaces that supply input and display information received from the cloud-based software 112.

The cloud-based software 112 may include hub services software 130 that maintains engineering data describing an industrial process and at least one application 140 that interacts with the clients 120 and utilizes the engineer data to provide services. The engineering data may be maintained in a 3D model that is part of a digital twin of an industrial process. In one implementation, the hub services 130 maintains the 3D model utilizing briefcases and changesets to enable multiple versions and concurrent operation. A briefcase is a particular instance of a database that represents a materialized view of information for a specific version. Initially an "empty" baseline briefcase may be programmatically created. Over time the baseline briefcase may be modified with changesets, which are persistent electronic records that capture changes needed to transform a particular instance from one version to a new version. Hub services 130 may maintain briefcases 160 and a set of accepted changesets 170 in a repository 150-154. When an application, such as application 140, needs to use a 3D model, it may obtain the briefcase 160 from a repository 150-154 closest to the desired state (e.g., the current state) and those accepted changesets 160 from a repository 150-154 that when applied bring that briefcase up to the desired state. To avoid the need to constantly access the repository 150-154, an application may maintain a local copy (not shown), that is periodically synchronized with the information maintained in a repository 150-154.

In one implementation, the application 140 is a PlantSight® cloud-based solution that provides access to digital twins that synchronize physical reality and engineering data from disparate data sources, including 3D models, to provide holistic context useful in the design, operation and/or maintenance of industrial processes. As part of its operation, the application 140 displays and allow users to interact with via the clients 120 already generated PFS diagrams (or more specifically P&ID) that describe industrial processes. Further, as explained below, the application 140, working together with clients 120, may implement a multi-stage PFS diagram generation technique to iteratively define the layout of a new or updated PFS diagram from a subset of engineering data in a 3D model. Iterative definition may be enabled by repeatedly calling an automatic layout generator 142, which each time solves for one unknown quality of the PFS diagram, taking into consideration user preferences 144.

Figure 2:
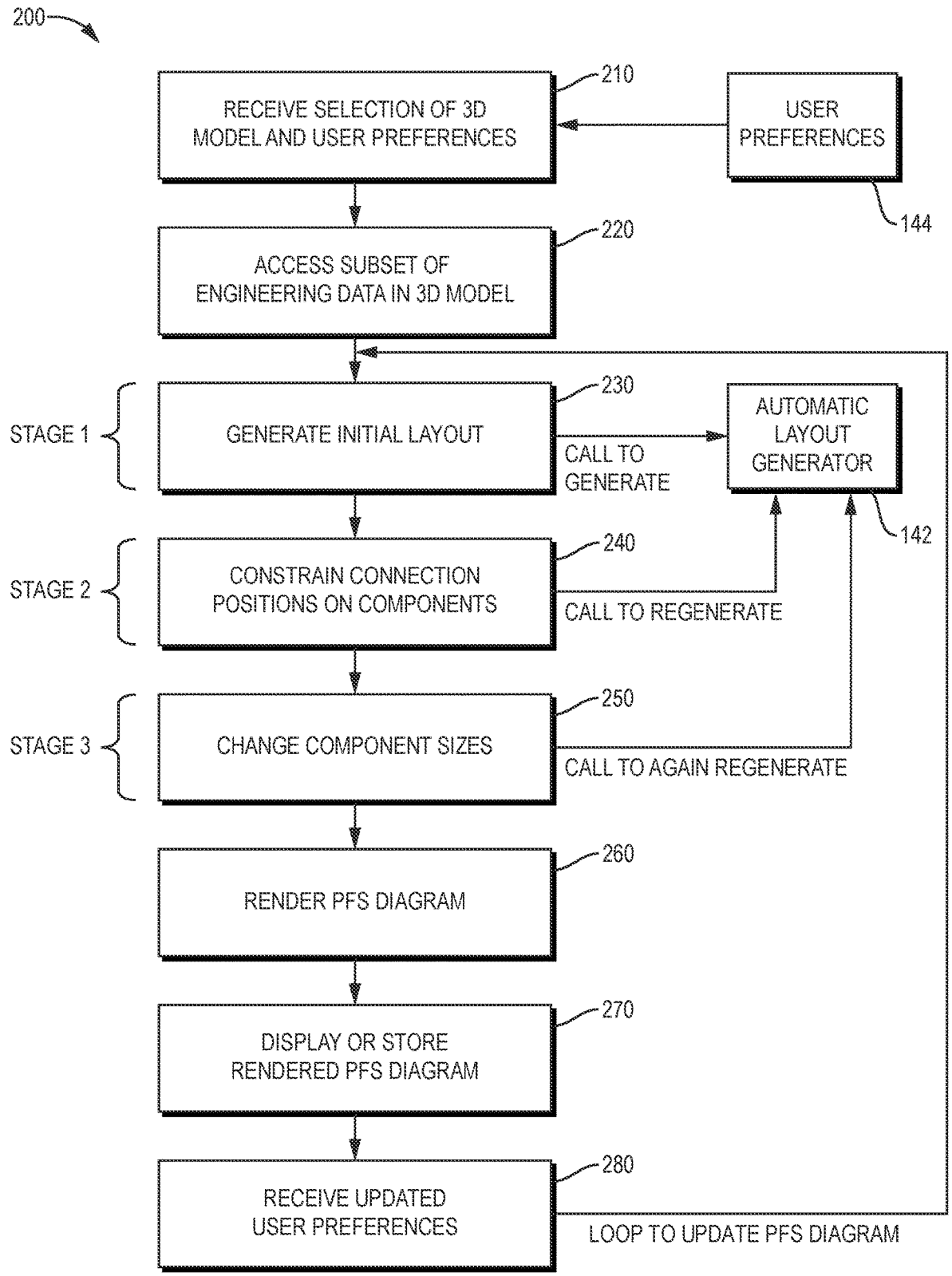
FIG. 2 is a flow diagram of an example sequence of steps that may be executed by an application to generate a PFS diagram from engineering data in a 3D model of an industrial process.
Figure 3:
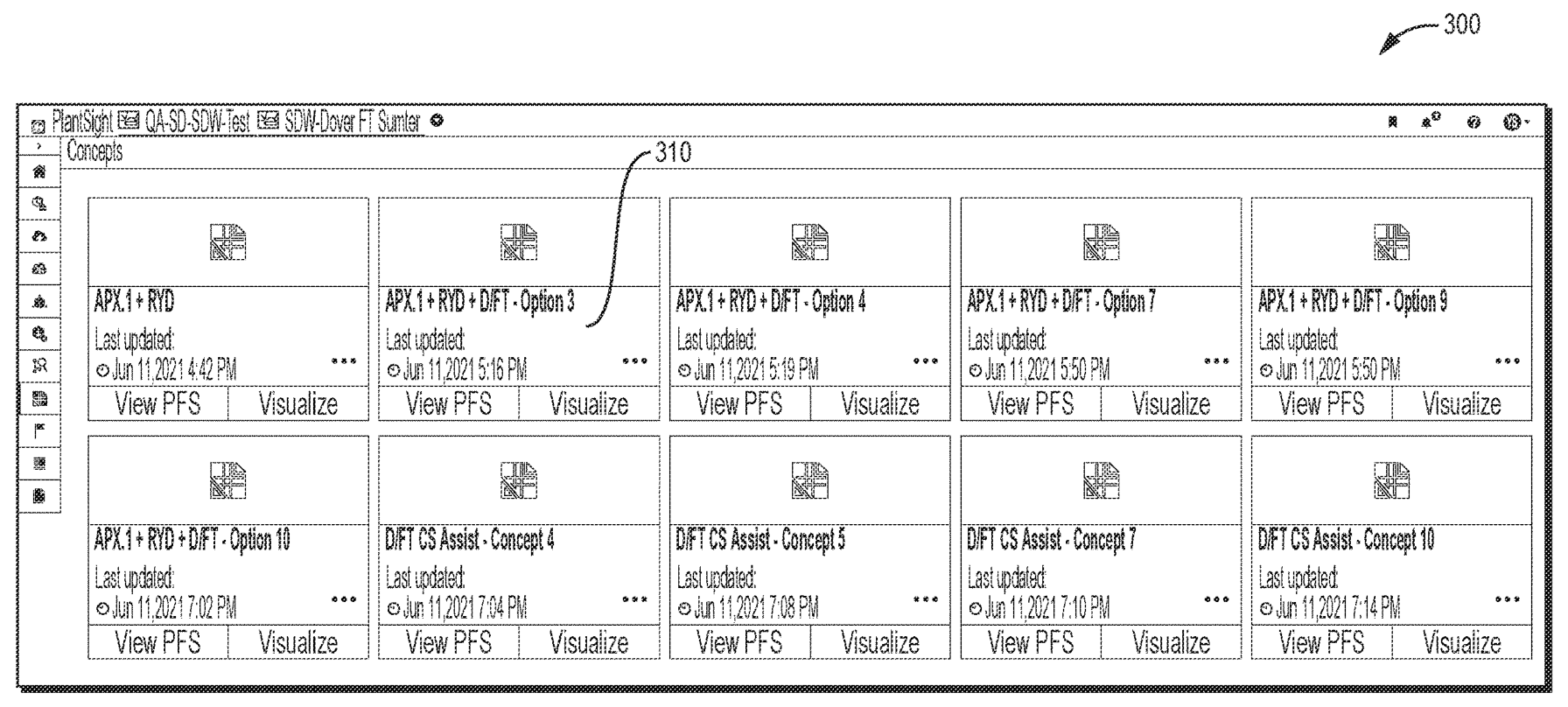
Figure 4:
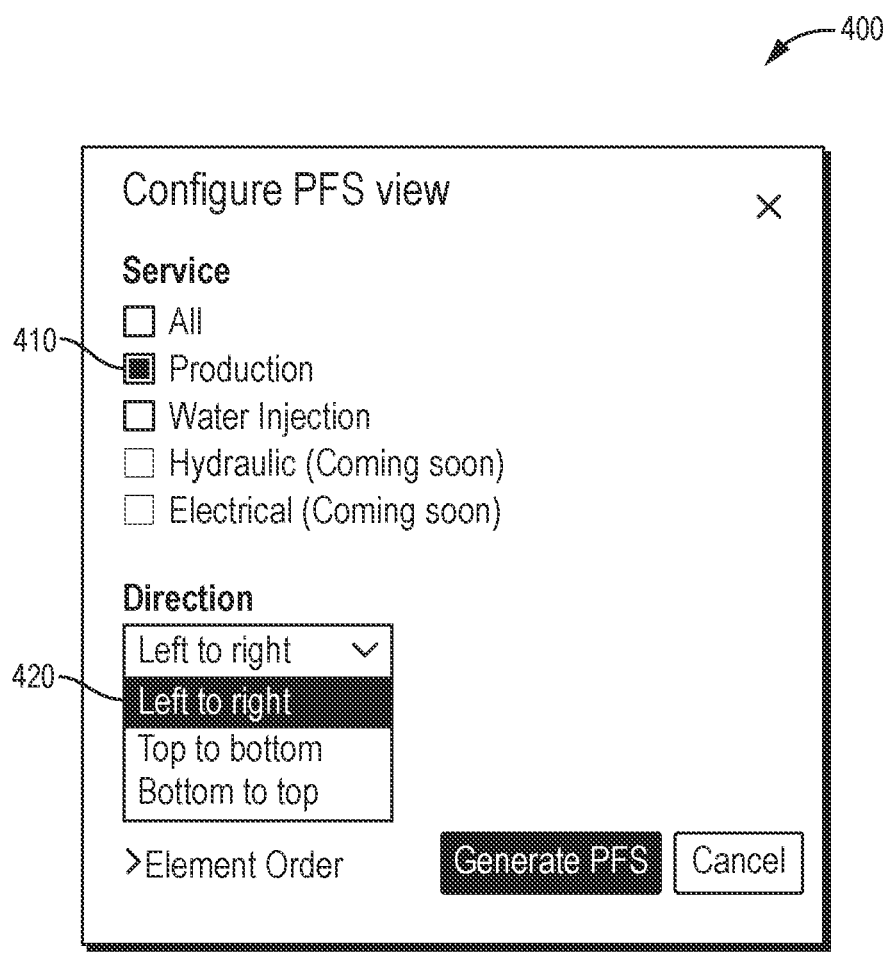
FIG. 4 is a screen shot of an example user interface that may be provided to permit entry of user preferences for generating a PFS diagram from engineering data in a 3D model.

FIG. 2 is a flow diagram of an example sequence of steps that may be executed by the application 140 to generate a PFS diagram (e.g., P&ID) from engineering data in a 3D model of an industrial process. At step 210, the application 140 receives from a client 120 a selection of a 3D model whose engineering data is to be used to generate a PFS diagram and user preferences 144 for such generation. In some cases, there them be multiple versions, and such selection may include selecting a particular version. FIG. 3 is a screen shot of an example user interface 300 that may be provided by a client 120 to permit selection of a 3D model from which to generate a PFS diagram. A number of 3D models may be listed, and a user may select a "view PFS" interface element (e.g., button) 310 associated with a particular one. FIG. 4 is a screen shot of an example user interface 400 that may be provided by a client 120 to permit entry of user preferences 144 for generating a PFS diagram from engineering data in the 3D model. The user preferences 144 may include a component type selection 410 that defines which components in the 3D model should be considered. For example, the user interface 400 may list a component type option of "production" the selection of which indicates only components in the 3D model involved in petroleum or chemical production should be considered. The user preferences 144 may also include a direction of layout 420 indicating which direction flow should be represented in the generated PFS diagram. For example, the user interface 400 may list a direction of layout option of "left to right" the selection of which indicates that flow should be represented accordingly in the generated PFS diagram. It should be understood that a wide variety of other user preferences 144 may be received and maintained as part of step 210, and that the example user interfaces 300, 400 may be adapted to allow user selection of such qualities.

At step 220, the application 140 access a subset of engineering data in the selected 3D model of an industrial process based on the user preferences. For example, depending on the component type selection received in step 210, engineering data for only components in the 3D model of the component type may be included in the subset. As discussed above, the application 140 may interact with hub services software 130 that maintains 3D models in repositories 150-154.

At step 230, the application 140 generates an initial layout for the PFS diagram from the subset of engineering data by calling 232 the automatic layout generator 142. The initial layout may specify relative positions of components in the PFS diagram. However, other aspects of the layout, such as connection positions on components and sizes of the components may not be determined or may be assigned non-final solutions to be refined later. In one implementation, the automatic layout generator 142 may be a JavaScript-based version of the Eclipse layout kernel (ELK) (collectively, ELKJS) which includes a collection of automatic layout algorithms for diagrams and supporting infrastructure for connecting to diagram viewers and editors. However, it should be understood that automatic layout generator 142 may be implemented by other kernels and libraries that include various automatic layout algorithms.

At step 240, the application 140 constrains connection positions on components in the PFS diagram based on the direction of layout in the user preferences, and regenerates the layout based on the constrained connection positions by again calling 242 the automatic layout generator 142. The automatic layout generator 142 previously could place connections on any side of the component in the initial layout. As part of step 240, the connection positions are constrained to either left/right (if the user preferences specify the direction of layout is left-to-right or right-to-left) or top/bottom (if the user preferences specify the direction of layout is top-to-bottom or bottom-to-top). The automatic layout generator 142 may regenerate the layout based on these constraints by performing an incremental refinement that updates connection positions on components and lines between components, but maintains relative positions of components unchanged in the layout.

It may be noted that updating connection positions through this sort of incremental refinement may produce better results than alternative techniques. Some automatic layout algorithms that may be used by automatic layout generator 142 do not guarantee a preferred direction among component types. Accordingly, it may be difficult to effectively constrain connection positions on components before there is some knowledge of relative positions of components.

At step 250, the application 140 changing sizes of the components in the PFS diagram to ensure adequate space for connections and any text labels, and again regenerates the layout based on the constrained connection positions by yet again calling 252 the automatic layout generator 142. The automatic layout generator 142 previously could crowd connections and text labels onto a component, with no minimum spacing for the connections or their text labels. In some cases, it also may have placed connections that are not connected to any component. As part of step 250, the application updates sizes of components to make components smaller/larger or wider/taller depending on a number of connections, to ensure minimum spacing thresholds are met while not consuming excessive space, and prunes any connections that are not connected to a component. In some implementations, a minimum height and width may be maintained even if the number of connections requires less height or width.

It may be noted that updating sizes of components through this sort of incremental refinement may produce better results than alternative techniques. Some automatic layout algorithms that may be used by automatic layout generator 142 may alter connection positions to try to reduce line crossings. Accordingly, it may be difficult to effectively change sizes of the components to reduce crowding before connection positions are constrained.

At step 260, the application 140 renders the PFS diagram based on the layout. Rendering the PFS diagram may include generating a scalable vector graphics (SVG) representation in which components, connections, lines and labels are represented in an extensible markup language (XML) based vector image format.

Figure 5:
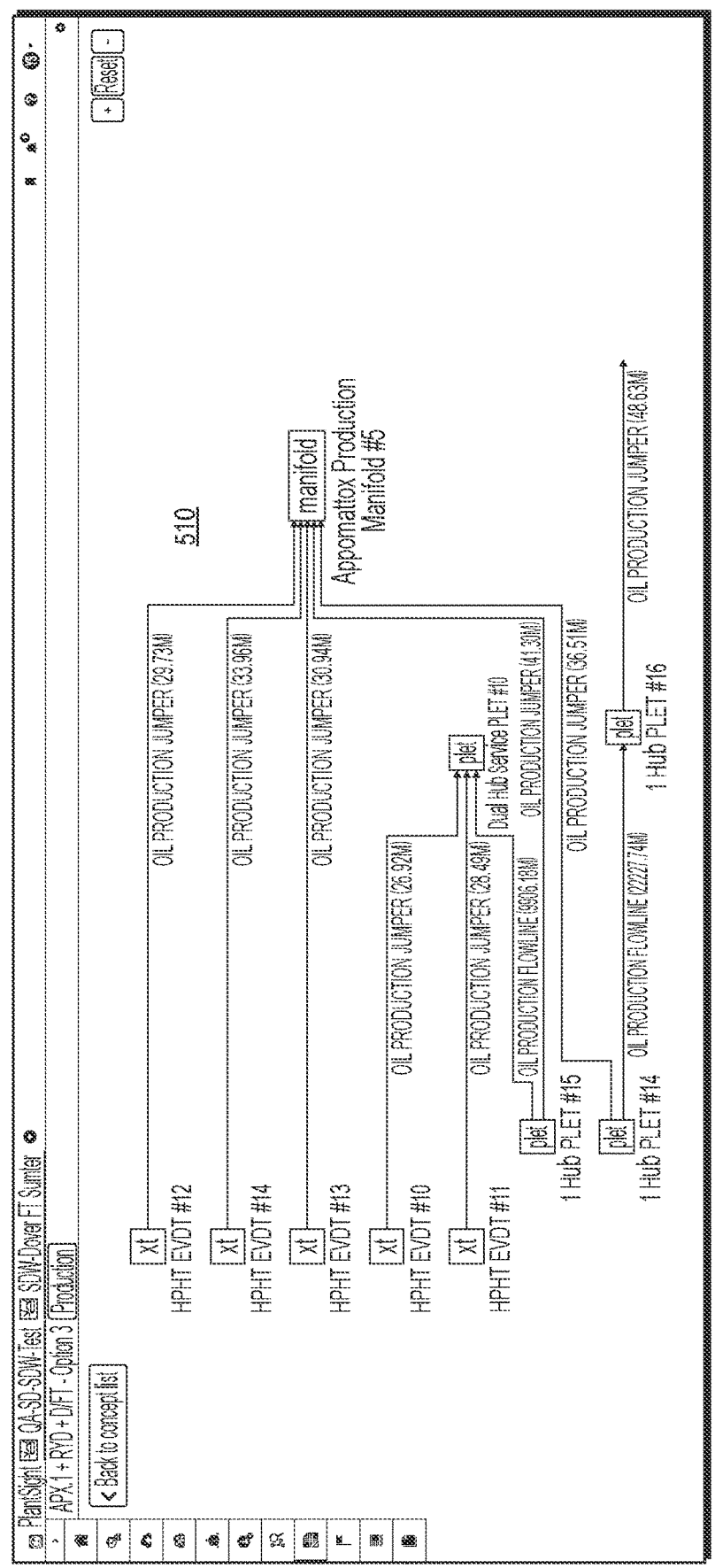
FIG. 5 is a screen shot of an example user interface that may be provided to show a rendered PFS diagram.

At step 270, the application 140 displays the rendered PFS diagram in the user interface of a client 120 and/or stores the rendered PFS diagram to memory of one more or more computing devices, for example, storing the SVG representation locally or interacting with hub services software 130 to store the SVG representation to a repository 150-154. FIG. 5 is a screen shot of an example user interface 500 that may be provided by a client 120 showing a rendered PFS diagram 510 produced as described above.

Figure 6:
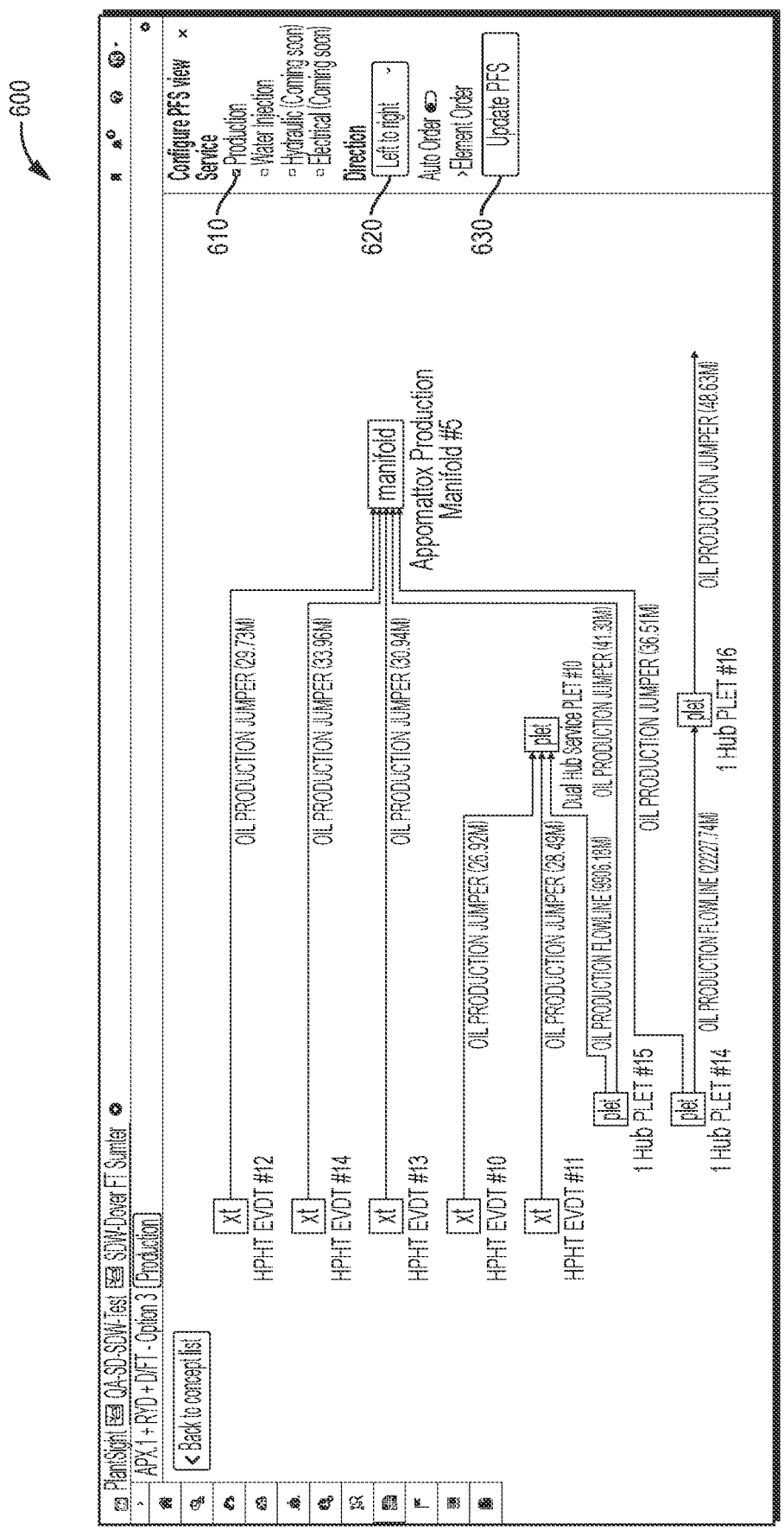
FIG. 6 is a screen shot of an example user interface that may be provided to permit entry of updated user preferences for generating an updated PFS diagram.

At optional step 280, the application 140 receives from a client 120 updated user preferences 144 and execution loops to step 230 to repeat multi-stage PFS diagram generation for the engineering data in the 3D model to produce an updated PFS diagram. FIG. 6 is a screen shot of an example user interface 600 that may be provided by a client 120 to permit entry of updated user preferences 144 for generating an updated PFS diagram. For example, the user may change the component type selection 610 or direction of layout 620 in the user interface and select an update button 620 to trigger production of an updated PFS diagram that incorporates those preferences.

In summary, a multi-stage PFS diagram generation technique is provided that iteratively defines the layout of a PFS diagram from a subset of engineering data in a 3D model of an industrial process. The multi-stage PFS diagram generation technique may repeatedly call an automatic layout generator, which each time solves for one unknown quality of the PFS diagram (e.g., relative positions of components in the PFS diagram, positions on components in the PFS diagram, sizes of the components in the PFS diagram). It should be remembered that functionality may be implemented using different software, hardware, and various combinations thereof. Software implementations may include electronic device-executable instructions (e.g., computer-executable instructions) stored in a non-transitory electronic device-readable medium (e.g., a non-transitory computer-readable medium), such as a volatile memory, a persistent storage device, or other tangible medium. Hardware implementations may include logic circuits, application specific integrated circuits, and/or other types of hardware components. Further, combined software/hardware implementations may include both electronic device-executable instructions stored in a non-transitory electronic device-readable medium, as well as one or more hardware components. Above all, it should be understood that the above description is meant to be taken only by way of example.

What is claimed is:

1. A method for iteratively generating a process flow schema (PFS) diagram from engineering data, comprising:
 accessing, by an application executing on a computing device, a subset of engineering data in a three-dimensional (3D) model of an industrial process, the subset of engineering data describing a plurality of components of the industrial process;
 initially generating, by an automatic layout generator of the application, a layout of the PFS diagram by determining relative positions of components in the PFS diagram from the subset of engineering data, wherein the initially generating allows unconstrained connection positions on components and any spacing of connections;
constraining connection positions on components in the PFS diagram;
regenerating, by the automatic layout generator, the layout based on the constrained connection positions;
changing sizes of the components in the PFS diagram to provide a minimum spacing of connections;
further regenerating, by the automatic layout generator, the layout based on the changed sizes of the components that provide the minimum spacing of connections;
rendering the PFS diagram based on the layout; and
displaying the rendered PFS diagram in a user interface and/or storing the rendered PFS diagram to memory of the computing device.

2. The method of claim 1, further comprising:
receiving, by the application, user preferences in the user interface, the user preferences including a component type selection,
wherein the plurality of components described by the subset of engineering data are chosen based on the component type selection.

3. The method of claim 1, further comprising:
receiving, by the application, user preferences in the user interface, the user preferences including at least a direction of the layout,
wherein the connection positions are constrained based on the direction of the layout.

4. The method of claim 1, wherein the regenerating is an incremental refinement that updates connection positions on components and lines between components in the layout, but maintains relative positions of components unchanged in the layout.

5. The method of claim 4, wherein the incremental refinement updates connection positions on components to constrain the connections positions to one of left/right or top/bottom.

6. The method of claim 1, wherein the further regenerating is an incremental refinement that updates sizes of components and lines between components in the layout, but maintains connection positions on components and relative positions of components unchanged in the layout.

7. The method of claim 1, wherein the incremental refinement updates sizes of components to one of make components smaller/larger or wider/taller depending on a number of connections.

8. The method of claim 1, wherein the rendering the PFS diagram further comprises:
selecting a text size for components and line labels in the PFS diagram.

9. The method of claim 1, wherein the PFS diagram is a piping and instrument drawing (P&ID).

10. The method of claim 1, wherein the 3D model is part of a digital twin of the industrial process maintained by the application.

11. A method for iteratively generating a process flow schema (PFS) diagram from engineering data, comprising:
accessing, by an application executing on a computing device, a subset of engineering data in a three-dimensional (3D) model of an industrial process, the subset of engineering data describing a plurality of components of the industrial process;
iteratively defining, by the application, a layout of a PFS diagram by solving one at a time for a plurality of unknown qualities of the PFS diagram, wherein the iteratively defining comprises:
initially generating, by an automatic layout generator of the application, a layout of the PFS diagram by determining relative positions of components in the PFS diagram from the subset of engineering data, wherein the initially generating allows unconstrained connection positions on components and any spacing of connections,
constraining connection positions on components in the PFS diagram,
regenerating, by the automatic layout generator, the layout based on the constrained connection positions,
changing sizes of the components in the PFS diagram to provide a minimum spacing of connections, and
regenerating, by the automatic layout generator, the layout based on the changed sizes of the components that provide the minimum spacing of connections;
rendering the PFS diagram based on the layout; and
displaying the rendered PFS diagram in a user interface and/or storing the rendered PFS diagram to memory of the computing device.

12. The method of claim 11, further comprising:
receiving, by the application, user preferences in the user interface, the user preferences including a component type selection,
wherein the plurality of components described by the subset of engineering data are chosen based on the component type selection.

13. The method of claim 11, further comprising:
receiving, by the application, user preferences in the user interface, the user preferences including at least a direction of the layout,
wherein the connection positions are constrained based on the direction of the layout.

14. A non-transitory electronic device readable medium having instructions stored thereon that when executed on one or more processors are operable to:
access engineering data in a three-dimensional (3D) model of an industrial process, the engineering data describing a plurality of components of the industrial process;
initially generate a layout of a PFS diagram by determining relative positions of components in the PFS diagram from the subset of engineering data, wherein the initial generation allows unconstrained connection positions on components and any spacing of connections;
constrain connection positions on components in the PFS diagram;
regenerate the layout based on the constrained connection positions;
change sizes of the components in the PFS diagram to provide a minimum spacing of connections;
further regenerate the layout based on the changed sizes of the components that provide the minimum spacing of connections; and
render the PFS diagram based on the layout.

15. The non-transitory electronic device readable medium of claim 14, wherein the instructions when executed are further operable to:
receive user preferences including at least a direction of the layout,
wherein the connection positions are constrained based on the direction of the layout.

16. The non-transitory electronic device readable medium of claim 14, wherein the instructions when executed are further operable to:
- receive user preferences including a component type selection,
- wherein the plurality of components described by the subset of engineering data are chosen based on the component type selection.

17. The non-transitory electronic device readable medium of claim 14, wherein the instructions that when executed are operable to regenerate are operable to update connection positions on components and lines between components in the layout, but maintain relative positions of components unchanged in the layout.

18. The non-transitory electronic device readable medium of claim 14, wherein the instructions that when executed are operable to further regenerate are operable to update sizes of components and lines between components in the layout, but maintain connection positions on components and relative positions of components unchanged in the layout.

19. The non-transitory electronic device readable medium of claim 14, wherein the instructions when executed are further operable to:
- select a text size for components and line labels in the PFS diagram.

\* \* \* \* \*

UNITED STATES PATENT AND TRADEMARK OFFICE
CERTIFICATE OF CORRECTION

Page 1 of 1

PATENT NO. : 12,276,971 B2
APPLICATION NO. : 17/587746
DATED : April 15, 2025
INVENTOR(S) : Yogesh Sajanikar It is certified that error appears in the above-identified patent and that said Letters Patent is hereby corrected as shown below:

In the Specification

Column 1, Line 39 reads:
"flow rate, density, etc.) and the like. PES diagrams typically"
Should read:
-- flow rate, density, etc.) and the like. PFS diagrams typically --

Column 1, Line 45 reads:
"ings (P&ID) may be considered a more detailed firm of a"
Should read:
-- ings (P&ID) may be considered a more detailed form of a --

Column 4, Line 15 reads:
"specifically P&ID) that describe industrial processes. Fur-"
Should read:
-- specifically P&IDs) that describe industrial processes. Fur- --

Signed and Sealed this
Twenty-sixth Day of August, 2025

Coke Morgan Stewart
*Acting Director of the United States Patent and Trademark Office*